United States Patent
Liu et al.

(10) Patent No.: US 12,400,051 B2
(45) Date of Patent: Aug. 26, 2025

(54) METHOD FOR MANUFACTURING SEAT FOR MEASURING STANDARD DRIVING POSTURE OF HUMAN BODY

(71) Applicant: CHINA AUTOMOTIVE TECHNOLOGY AND RESEARCH CENTER CO., LTD., Tianjin (CN)

(72) Inventors: Zhixin Liu, Tianjin (CN); Weidong Liu, Tianjin (CN); Yongqiang Wu, Tianjin (CN); Zhengqi Fan, Tianjin (CN); Kai Wang, Tianjin (CN); Tianyi Hao, Tianjin (CN); Hanxiao Zhang, Tianjin (CN); Yuechen Ji, Tianjin (CN); Bosong Liu, Tianjin (CN); Minghao Xie, Tianjin (CN)

(73) Assignee: CHINA AUTOMOTIVE TECHNOLOGY AND RESEARCH CENTER CO., LTD., Tianjin (CN)

( * ) Notice: Subject to any disclaimer, the term of this patent is extended or adjusted under 35 U.S.C. 154(b) by 0 days.

(21) Appl. No.: 18/797,897

(22) Filed: Aug. 8, 2024

(65) Prior Publication Data
US 2025/0252226 A1 Aug. 7, 2025

(30) Foreign Application Priority Data
Feb. 7, 2024 (CN) .......................... 202410171801.8

(51) Int. Cl.
*G06F 30/15* (2020.01)
(52) U.S. Cl.
CPC .................................. *G06F 30/15* (2020.01)

(58) Field of Classification Search
CPC ........... G06F 30/00; G06F 30/15; G06F 30/10
(Continued)

(56) References Cited

U.S. PATENT DOCUMENTS

2018/0240281 A1   8/2018   Vincelette

FOREIGN PATENT DOCUMENTS

| CN | 108959814 A | * | 12/2018 | ............. G06F 30/15 |
| CN | 109614646 A | * | 4/2019 | |

(Continued)

OTHER PUBLICATIONS

Liu, Chunyan et al., "Human Shape Feature Detection System Based on 3D Laser Scanning", 2023, U.P.B. Sci. Bull., Series C, vol. 85, Iss. 2. (Year: 2023).*

(Continued)

*Primary Examiner* — Cedric Johnson
(74) *Attorney, Agent, or Firm* — Westbridge IP LLC

(57) ABSTRACT

A method for manufacturing a seat for measuring a standard driving posture of a human body includes: performing three-dimensional scanning on an auxiliary device to acquire a first point cloud data set; constructing N seat curves according to the plurality of groups of displacement data sets; correspondingly processing the N seat curves and the first point cloud data set to delete the point cloud data above the seat curves so as to obtain a second point cloud data set; and performing inverse modeling on the second point cloud data set to obtain a rigid seat model for manufacturing a rigid seat. The rigid seat manufactured through the method facilitates putting a dummy in a standard driving posture and also can avoid the problem that key sizes of the dummy are not correctly measured due to deformation of the seat surface.

4 Claims, 11 Drawing Sheets

(58) Field of Classification Search
USPC .......................................................... 703/8, 6
See application file for complete search history.

(56) References Cited

FOREIGN PATENT DOCUMENTS

| CN | 111735385 | A | | 10/2020 |
|---|---|---|---|---|
| CN | 113188442 | A | | 7/2021 |
| CN | 113602222 | A | | 11/2021 |
| CN | 115546061 | A | | 12/2022 |
| CN | 116186870 | A | | 5/2023 |
| CN | 117094186 | A | * | 11/2023 |
| WO | WO-2024009829 | A1 | * | 1/2024 |

OTHER PUBLICATIONS

First Office Action issued in counterpart Chinese Patent Application No. 202410171801.8, dated Mar. 23, 2024.
Gu et al., Car Seat Structure Design Based on 3D Sitting Model and NURBS Surface Modeling, Machinery Design & Manufacture, 2020 (10), pp. 192-195, dated Oct. 8, 2020.
Zhang et al., Confirmation of Seat Datum Point Based on ATOS Data Collection, Processing and Analysis, Auto Time, 2020 (14), pp. 123-125, dated Jul. 5, 2020.
Zhang et al., Model Reconstruction and Rapid Prototyping of Pilot's Seat Back, China Plastics Industry, vol. 45, No. 6, pp. 43-49, dated Jun. 20, 2017.

* cited by examiner

METHOD FOR MANUFACTURING SEAT FOR MEASURING STANDARD DRIVING POSTURE OF HUMAN BODY

CROSS-REFERENCE TO RELATED APPLICATIONS

This application claims priority to Chinese Patent Application No. 202410171801.8, filed on Feb. 7, 2024, the content of which is incorporated herein by reference in its entirety.

TECHNICAL FIELD

The present application relates to the technical field of vehicle testing and particularly relates to a method for manufacturing a seat for measuring a standard driving posture of a human body.

BACKGROUND

An automobile collision dummy is high-end detection equipment for evaluating automobile safety. Using a collision dummy instead of a real person for a collision test can simulate human injury conditions in different situations. Before the collision test, the dummy needs to be placed in the vehicle according to the specified posture so as to reduce the test result errors caused by inconsistent postures.

In the prior art, efforts are mainly given to seat safety and lightweight improvement. Therefore, the shape of the seat surface is not suitable for collecting standard driving postures of the human body, and the backrest structure is not conducive to measuring feature points of the human back due to that surfaces of leather seats and fabric seats are prone to deformation and stiffness changes. As a result, measurement accuracy and precision are affected.

SUMMARY

Given the above-mentioned defects or deficiencies in the prior art, it is expected to provide a method for manufacturing a seat for measuring a standard driving posture of a human body to solve the above-mentioned problem.

The present application provides a method for manufacturing a seat for measuring a standard driving posture of a human body, implementation of the method is based on an auxiliary device, where the auxiliary device is a seat, N sensor groups are arranged on the seat, each sensor group includes a group of displacement sensors on the back of the seat and a group of displacement sensors on a cushion, the group of displacement sensors on the back of the seat is arranged in the length direction of the back of the seat, and the group of displacement sensors on the cushion is arranged in the length direction of the cushion.

The method including the following steps:

S100: selecting a plurality of testers and performing three-dimensional scanning on the auxiliary device to acquire a first point cloud data set, where the height of each tester is the 50th percentile height of Chinese males, and the first point cloud data set includes a plurality of point cloud data;

S200: acquiring a plurality of groups of displacement data sets, and constructing N seat curves according to the plurality of groups of displacement data sets, where the displacement data sets include displacement values measured by all displacement sensors when one of the testers is on the auxiliary device and keeps a standard driving posture;

S300: correspondingly processing the N seat curves and the first point cloud data set to delete the point cloud data above the seat curves so as to adjust the first point cloud data set and obtain a second point cloud data set; and S400: performing inverse modeling on the second point cloud data set to obtain a rigid seat model, and manufacturing a rigid seat according to the rigid seat model.

According to the technical solution of the present application, the rigid seat includes a sitting plate for sitting and a backup plate for back leaning, and the after manufacturing a rigid seat according to seat curve further includes the following steps:

forming a first measuring hole in the middle of the backup plate, where the first measuring hole takes the shape of a long strip and extends in the vertical direction; and forming a second measuring hole in the backup plate corresponding to a spealbone, where the second measuring hole is circular.

According to the technical solution of the present application, the sensor groups are distributed sparsely at positions close to an axis of symmetry of the seat and are distributed densely at positions away from the axis of symmetry of the seat.

Compared with the prior art, the beneficial effects of the present application are as follows: by selecting several testers whose height is the 50th percentile height of Chinese males for testing, the rigid seats manufactured can better adapt to the driving posture of Chinese people; by constructing the seat curve, the seat curve can accurately represent the changes in the surface of the seat when the tester is placed on the seat; and further by referring to the seat curve, the point cloud data is deleted, so that the rigid seat model is enabled to be more suitable for being sat by a human body more and is in the shape of a standard driving posture on one hand, and on the other hand, the point cloud data can be simplified to facilitate subsequent inverse modeling. After being sat by a dummy and the dummy fitting the seat surface, the rigid seat manufactured through the method provided by the present application can be directly placed in a standard driving posture without adjusting the posture of the dummy, avoids the problem that the key size of the dummy cannot be accurately measured, saves the test time and improves the test efficiency; and in addition, the rigid seat manufactured through the method provided by the present application more meets the standard driving posture of Chinese people.

BRIEF DESCRIPTION OF DRAWINGS

Other features, objectives and advantages of the present application will become more apparent by reading the detailed description of non-limiting embodiments made with reference to the following accompanying drawings.

DETAILED DESCRIPTION OF THE EMBODIMENTS

Figure 1A:
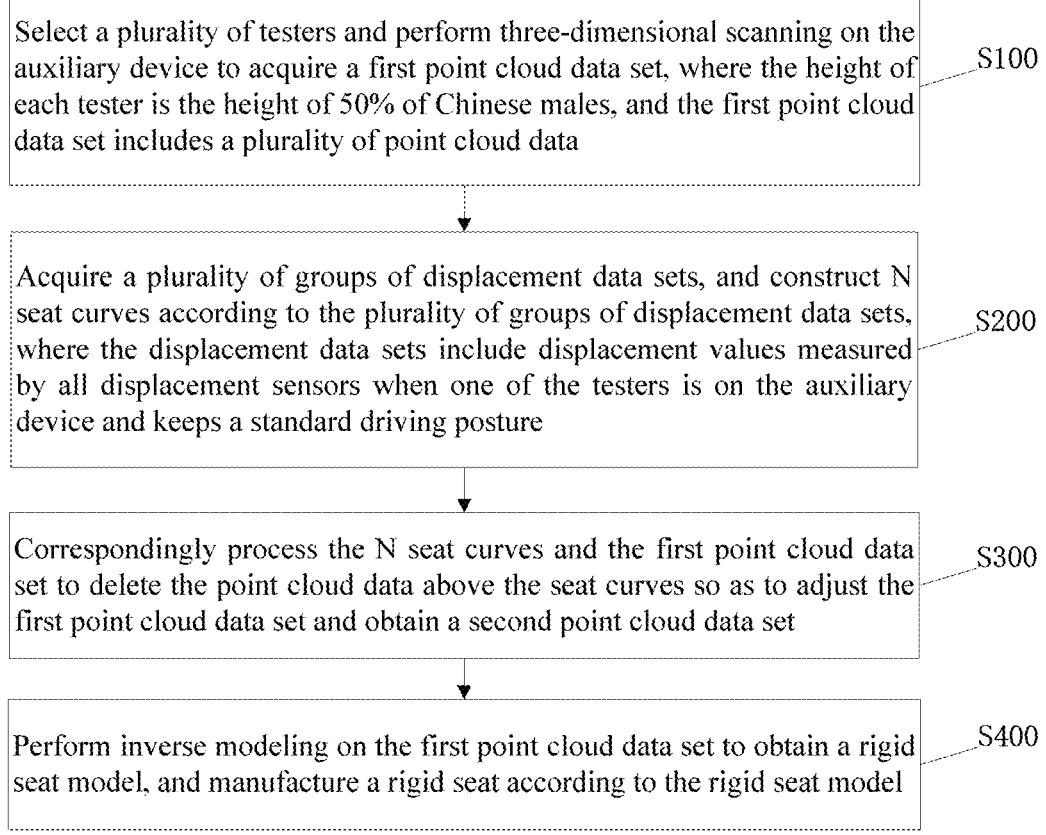
FIG. 1a is a flow chart I of steps of a method for manufacturing a seat for measuring a standard driving posture of a human body of the present application.

The present application is further described in detail below with reference to the accompanying drawings and embodiments. It can be understood that the specific embodiments described here are only used to explain the related application, but not to limit the present application. In addition, it needs to be noted that, for the convenience of description, only the parts related to the application are shown in the drawings.

It is to be noted that the embodiments and features in the embodiments of the present application may be combined with each other without conflict. The present application will be described below in detail with reference to the accompanying drawings and in conjunction with the embodiments.

Referring to FIG. 1a, the present application provides a method for manufacturing a seat for measuring a standard driving posture of a human body, implementation of the method is based on an auxiliary device, the auxiliary device is a seat, N sensor groups are arranged on the seat, each sensor group includes a group of displacement sensors on the back 2 of the seat and a group of displacement sensors on a cushion 1, the group of displacement sensors on the back 2 of the seat is arranged in the length direction of the back 2 of the seat, and the group of displacement sensors on the cushion 1 is arranged in the length direction of the cushion 1.

The method comprising the following steps:

S100: selecting a plurality of testers and performing three-dimensional scanning on the auxiliary device to acquire a first point cloud data set, where the height of each tester is the 50th percentile height of Chinese males, and the first point cloud data set comprises a plurality of point cloud data;

S200: acquiring a plurality of groups of displacement data sets, and constructing N seat curves according to the plurality of groups of displacement data sets, where the displacement data sets comprise displacement values measured by all displacement sensors when one of the testers is on the auxiliary device and keeps a standard driving posture;

S300: correspondingly processing the N seat curves and the first point cloud data set to delete the point cloud data above the seat curves so as to adjust the first point cloud data set and obtain a second point cloud data set; and S400: performing inverse modeling on the second point cloud data set to obtain a rigid seat model, and manufacturing a rigid seat according to the rigid seat model.

Further, the sensor groups are distributed sparsely at positions close to an axis of symmetry of the seat and are distributed densely at positions away from the axis of symmetry of the seat.

Figure 2:
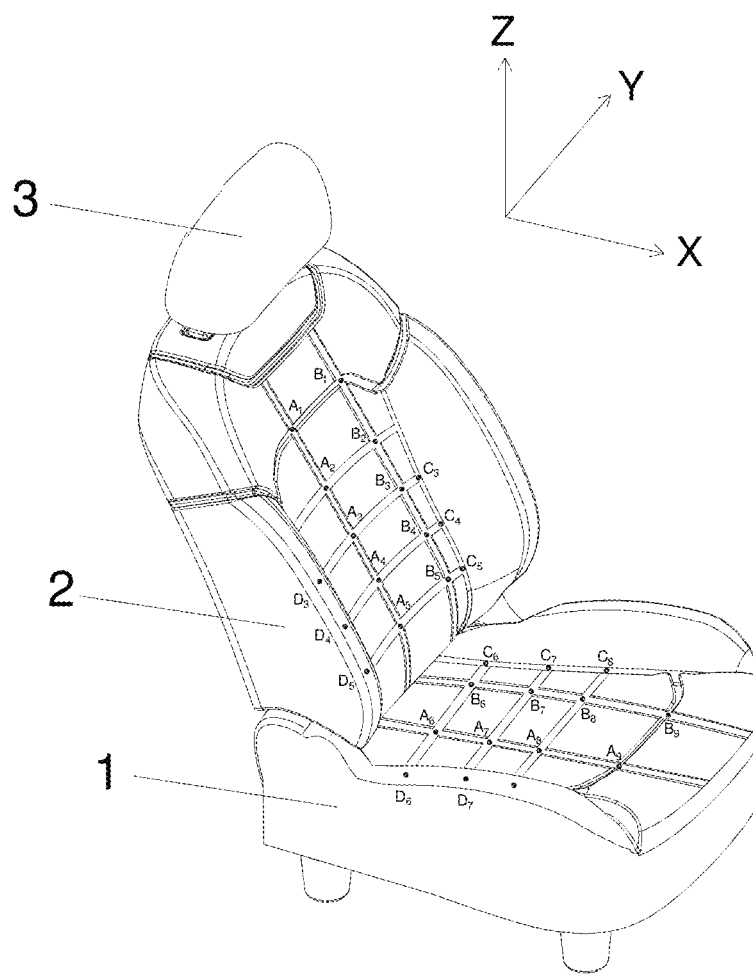
FIG. 2 is a schematic structural diagram of an auxiliary device.

Specifically, referring to FIG. 2, the auxiliary device is a seat, and the seat can be selected from a automobile seat; the back 2 and the cushion 1 of the seat are made of a soft elastic material, the angle between the back 2 and the cushion 1 of the seat is adjustable, and preferably, the angle between the back 2 and the cushion 1 of the seat is 63°; a plurality of displacement sensors are mounted on each of the back 2 and the cushion 1 of the seat for detecting displacements of all position points of one side of the back 2 and the cushion 1 of the seat close to a human body; a plurality of displacement sensors are arranged into N arrays on the back 2 of the seat in the width direction of the back 2 of the seat; a plurality of displacement sensors are arranged into N arrays on the cushion 1 of the seat in the width direction of the cushion 1 of the seat, and preferably, N is 4; an array of displacement sensors on the back 2 of the seat and an array of displacement sensors on the cushion 1 of the seat constitute a sensor group; a group of sensors on the back 2 of the seat are arranged in the length direction of the back 2 of the seat; and a group of sensors on the cushion 1 are arranged in the length direction of the cushion 1. In the present embodiment, four sensor groups are constituted and are a sensor group A, a sensor group B, a sensor group C and a sensor group D; each of the sensor group A and the sensor group B includes nine displacement sensors and each of the sensor group C and the sensor group D includes six displacement sensors, so 30 sensors are included in total; the 30 sensors are marked as $A_1$-$A_9$, $B_1$-$B_9$, $C_3$-$C_8$ and $D_3$-$D_8$ respectively; on the back 2 of the seat, $A_1$-$A_5$ and $B_1$-$B_5$ are symmetrical about the center line of the back 2 of the seat, $C_3$-$C_5$ and $D_3$-$D_5$ are symmetrical about the center of the back 2 of the seat; and on the cushion 1, $A_6$-$A_9$ and $B_6$-$B_9$ are symmetrical about the center line of the cushion 1, and $C_6$-$C_8$ and $D_6$-$D_8$ are symmetrical about the center line of the cushion 1. When the displacement sensors are arranged, the measuring direction of each displacement sensor is enabled to be perpendicular to the seat surface where the displacement sensor is positioned, and the displacement sensors are connected through bolts, so a sensor base needs to be arranged on the mounting position of each displacement sensor, and the base and the seat are connected through bonding. After the displacement sensors are mounted, the upper surfaces of the displacement sensors are flush with the seat surface, and the measuring direction of the displacement sensors is enabled to be always perpendicular to the seat surface. The range of the displacement sensor is 0-50,000 μm, the precision of the displacement sensor is less than F.S±5%, and the size of the displacement sensor is 10×10×8 m. In the FIGS., $D_3$-$D_8$ are schematic positions instead of actual positions.

On the back 2 of the seat, the space between the sensor group A and the sensor group B is 80 mm, the space between every two adjacent displacement sensors in each of the sensor group A and the sensor group B is 80 mm, the space between the sensor group B and the sensor group C is 50 mm, the space between the sensor group A and the sensor group D is 50 mm, and the space between every two adjacent displacement sensors in each of the sensor group C and the sensor group D is 80 mm; and on the cushion 1 of the seat, the space between the sensor group A and the sensor group B is 80 mm, the space between every two adjacent displacement sensors in each of the sensor group A and the sensor group B is 80 mm, the space between the sensor group B and the sensor group C is 50-60 mm, and the space between the sensor group A and the sensor group D is 50-60 mm. Given that the surface of the cushion 1 of the seat is a curved surface, the arrangement error of the displacement sensors is within 5 mm. Due to the fact that the top half part of the driver's back does not fully fit the back 2 of the seat while driving, there is no need to arrange the displacement sensor on the position of the back 2 of the seat close to the headrest 3.

Specifically, in S100, the of selecting a plurality of tester is as follows.

Firstly, determining the percentile of the human body to be selected, then selecting 50 testers based on the height and weight of the percentile of the human body, measuring the sitting height and hip-knee distance on the seat of the testers, comparing the measuring data with the sitting height and hip-knee distance of the percentile of the human body, and select 30 testers closest to the standard size.

Specifically, in S100, the of performing three-dimensional scanning on the auxiliary device to acquire a first point cloud data set is as follows.

When the tester does not sit on the seat, using a laser scanner to scan the seat to acquire a first point cloud data set of the seat, where the first point cloud data set includes a plurality of point cloud data; and constructing a reference coordinate system with the center of the cushion 1 of the seat as the origin, the right ahead of the seat as the positive direction of X coordinate axis, the left side of the seat as the positive direction of Y coordinate axis, and the top of the seat as the positive direction of Z coordinate axis, where each point cloud data has a corresponding three-dimensional coordinate within the reference coordinate system. A plurality of point cloud data forms a three-dimensional model of the seat, and is not only formed on the surface of the three-dimensional model, but also on the interior of the three-dimensional model.

Figure 1B:
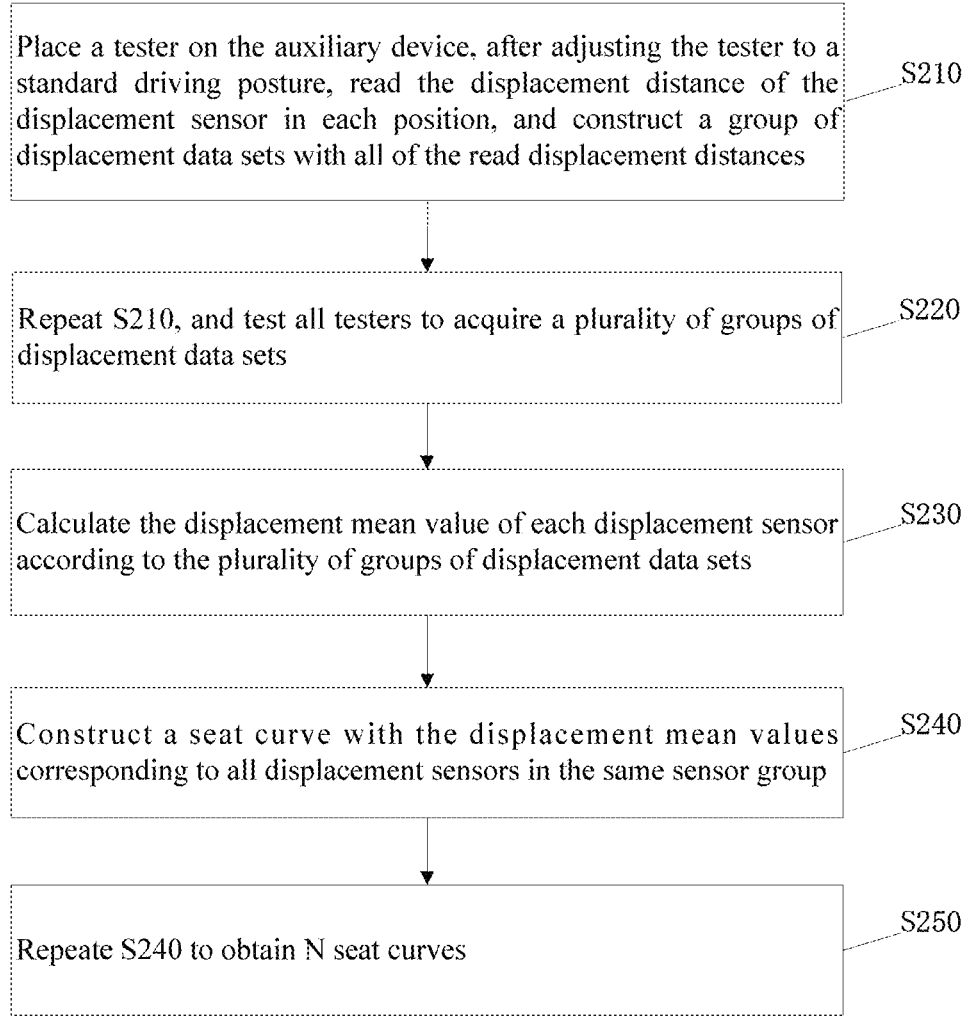
FIG. 1b is a flow chart II of steps of a method for manufacturing a seat for measuring a standard driving posture of a human body of the present application.

Further, referring to FIG. 1b, S200 specifically includes the following processes:

S210: placing a tester on the auxiliary device, after adjusting the tester to a standard driving posture, reading the displacement distance of the displacement sensor in each position, and constructing a group of displacement data sets with all of the read displacement distances;

S220: repeating S210, and testing all testers to acquire a plurality of groups of displacement data sets;

S230: calculating the displacement mean value of each displacement sensor according to the plurality of groups of displacement data sets;

S240: constructing a seat curve with the displacement mean values corresponding to all displacement sensors in the same sensor group; and S250: repeating S240 to obtain N seat curves.

Figure 3:
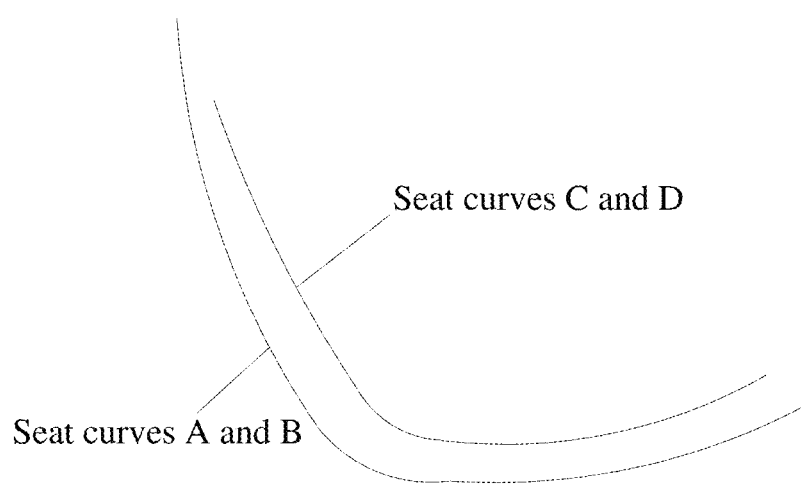
FIG. 3 is a schematic diagram of a side view of a seat curve.

Specifically, please refer to FIG. 3, S200 specifically includes:

firstly, recording the corresponding coordinate of each displacement sensor within the reference coordinate system before the seat deforms; then, enabling the testers to sit on the seat in a standard driving posture one by one, recording the displacement values measured by 30 displacement sensors, and the 30 displacement values forming a group of displacement data sets; obtaining 30 groups of displacement data sets in total from 30 testers; taking the sensing group A as an example, calculating the displacement mean value of displacement sensor $A_1$ based on the displacement data corresponding to displacement sensor $A_1$ in each group of displacement data sets among the 30 groups of displacement data sets to further obtain the displacement point of each displacement sensor in the XZ plane after movement in the sensor group A; by smoothly connecting the displacement points corresponding to each displacement sensor in sensor group A through curves to further obtain a corresponding seat curve of the sensor group A in the XZ plane; and by using the method, obtaining the corresponding seat curves of sensor group B, sensor group C, and sensor group D in the XZ plane respectively to finally obtain four seat curves, namely seat curve A, seat curve B, seat curve C, and seat curve D.

Figure 1C:
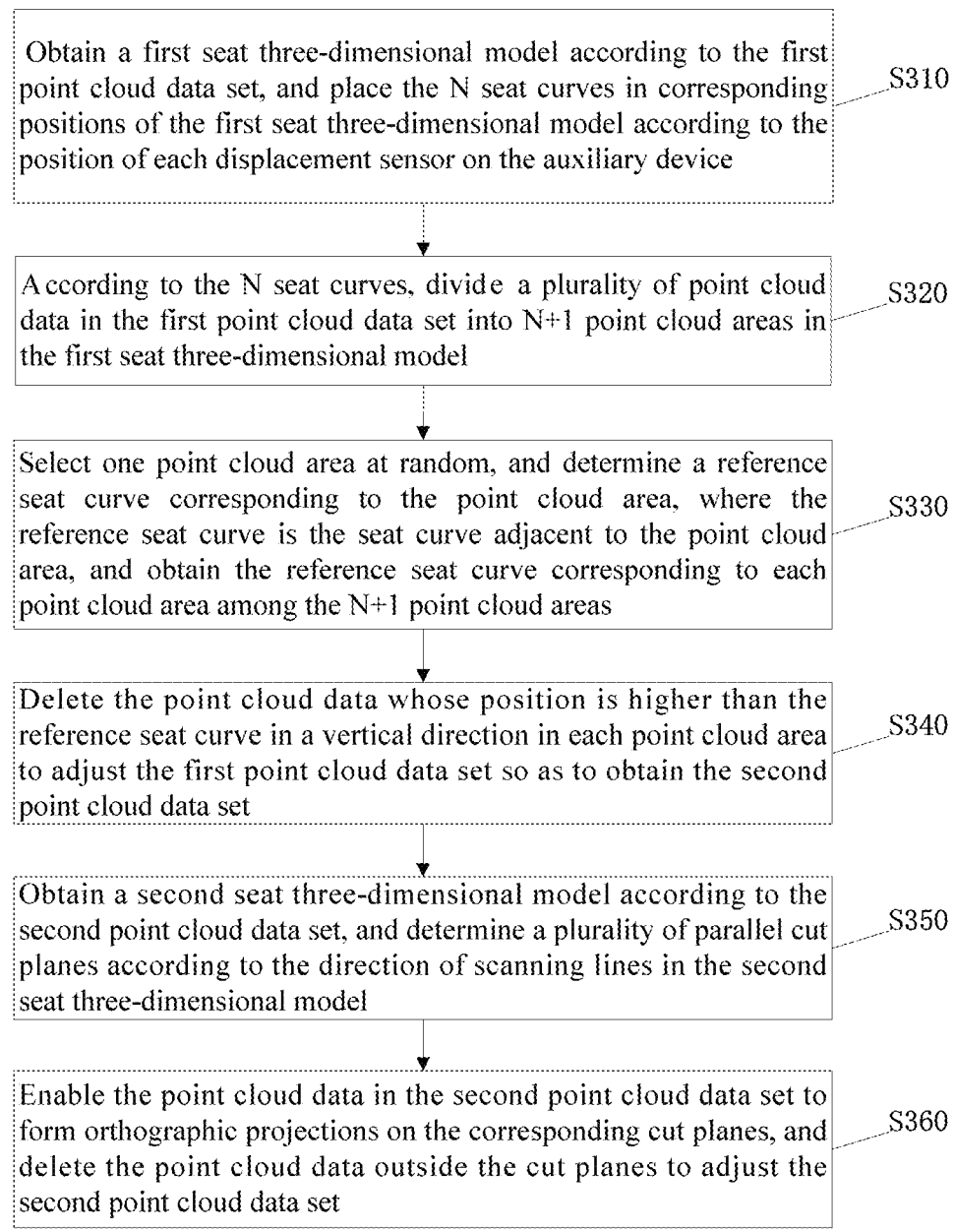
FIG. 1c is a flow chart III of steps of a method for manufacturing a seat for measuring a standard driving posture of a human body of the present application.

Further, referring to FIG. 1c, S300 specifically includes the following processes:

S310: obtaining a corresponding first seat three-dimensional model according to the first point cloud data set, and placing the N seat curves in corresponding positions of the first seat three-dimensional model according to the position of each displacement sensor on the auxiliary device;

S320: according to the N seat curves, dividing a plurality of point cloud data in the first point cloud data set into N+1 point cloud areas in the first seat three-dimensional model;

S330: selecting one point cloud area at random, and determining a reference seat curve corresponding to the point cloud area, where the reference seat curve is the seat curve adjacent to the point cloud area, and obtaining the reference seat curve corresponding to each point cloud area among the N+1 point cloud areas; and S340: deleting the point cloud data whose position is higher than the corresponding reference seat curve in the vertical direction in each point cloud area to adjust the first point cloud data set and obtain the second point cloud data set.

Figure 4:
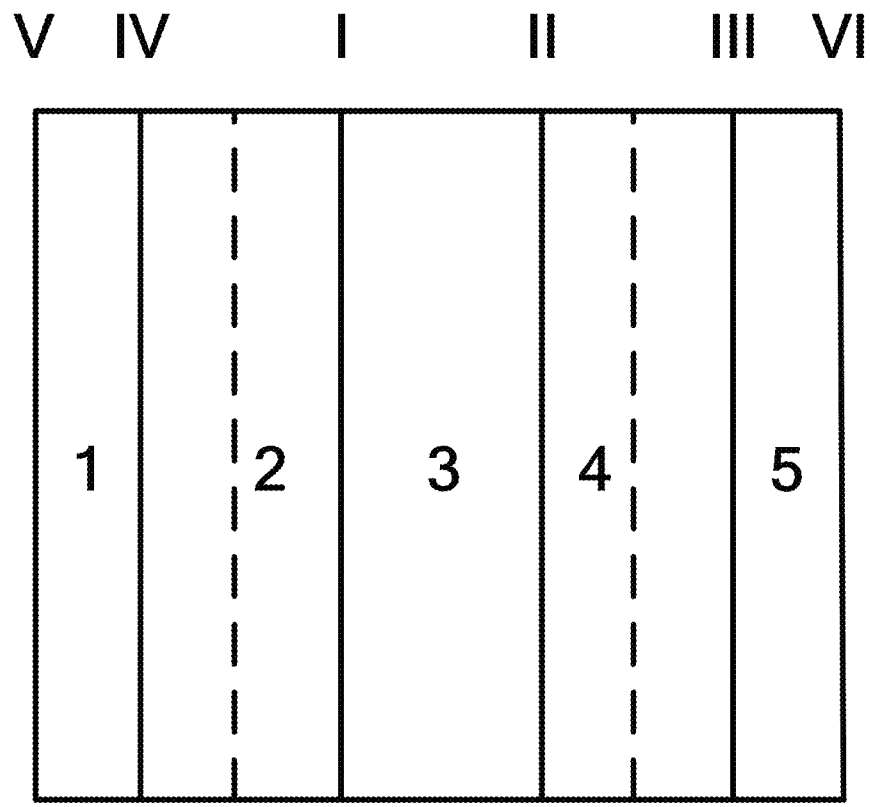
FIG. 4 is a schematic structure diagram of division of the point cloud area.

Specifically, correspond the displacement points used to constitute each seat curve to the reference coordinate system, so that the seat curve and the first point cloud data set are enabled to correspond to each other in the reference coordinate system; as shown in FIG. 4, columns I, II, III, and IV represent the four seat curves A, B, C, D respectively, and columns V and VI represent the left and right edges of the seat respectively; the first point cloud data set is divided into five point cloud areas by the plane where the four seat curves are located; area 1 includes columns IV to V on the rightmost side of the seat, area 2 includes columns IV to I, area 3 includes columns I to II, area 4 includes columns II to III, and area 5 includes columns III to VI on the leftmost side of the seat. Each of areas 2 and 4 includes two parts in bilateral symmetry; and then delete the point cloud data whose position is higher than the corresponding reference seat curve in the vertical direction in each point cloud area.

It should be noted that the number of the reference seat curve corresponding to one point cloud area may be one or more. Take area 1 as an example, it is only adjacent to the seat curve D corresponding to column IV. Therefore, the reference seat curve corresponding to area 1 is the seat curve D. Area 2 includes a left part and a right part, the left half part is adjacent to the seat curve D corresponding to column IV, the right half part is adjacent to the seat curve A corresponding to column I, that is, the reference seat curve corresponding to area 2 is the seat curve D corresponding to column IV and the seat curve A corresponding to column I, and the method is used to determine the reference seat curves corresponding to other point cloud areas; delete the point cloud data in the left half part of areas 1 and 2 and higher than the seat curve D in the direction of Z coordinate axis from the first point cloud data set, delete the point cloud data in the right half part of area 2 and in the left half part of areas 3 and 4 and higher than the seat curve A and seat curve B in the direction of Z coordinate axis from the first point cloud data set, delete the point cloud data in the right half part of area 4 and in area 5 and higher than the seat curve C in the direction of Z coordinate axis from the first point cloud data set, and finally complete the adjustment of the first point cloud data set to obtain the second point cloud data set, with the purpose of simplifying the point cloud data for the first time, and enabling the second point cloud data set obtained after adjustment to be more suitable for the standard driving posture of the human body.

Further, including the following steps between S340 and S400:

S350: obtaining a second seat three-dimensional model according to the second point cloud data set, and determining a plurality of parallel cut planes according to the direction of scanning lines in the second seat three-dimensional model, where the distance between every two adjacent cut planes is greater than that between every two adjacent scanning lines; and S360: enabling the point cloud data in the second point cloud data set to form orthographic projections on the corresponding cut planes, and deleting the point cloud data outside the cut planes to adjust the second point cloud data set.

Specifically, the point cloud data is usually stored according to scanning lines and is closely distributed around the scanning lines, and the spacing between every two adjacent scanning lines is large; therefore, based on the idea of a cut plane, the present application uses a layering method suitable for a point cloud topological structure of the seat. Firstly, according to the distribution of scanning lines in the second point cloud data set, a group of cut planes parallel to the scanning lines is used to layer the three-dimensionally distributed point cloud data set, and then, the point cloud data is projected onto the corresponding cut plane to obtain the point cloud data of each layer. Since the data measured by a three-dimensional laser scanner is stored according to the scanning line, as long as the cut plane is parallel to the scanning lines, the spacing between the cut planes is close to the spacing between the scanning lines, and the error caused by layering is very small, the basic contour of the seat model remains unchanged. In this way, the three-dimensionally distributed point cloud data can be converted into two-dimensionally distributed point cloud data for processing, thereby simplifying the processing process.

Figure 5:
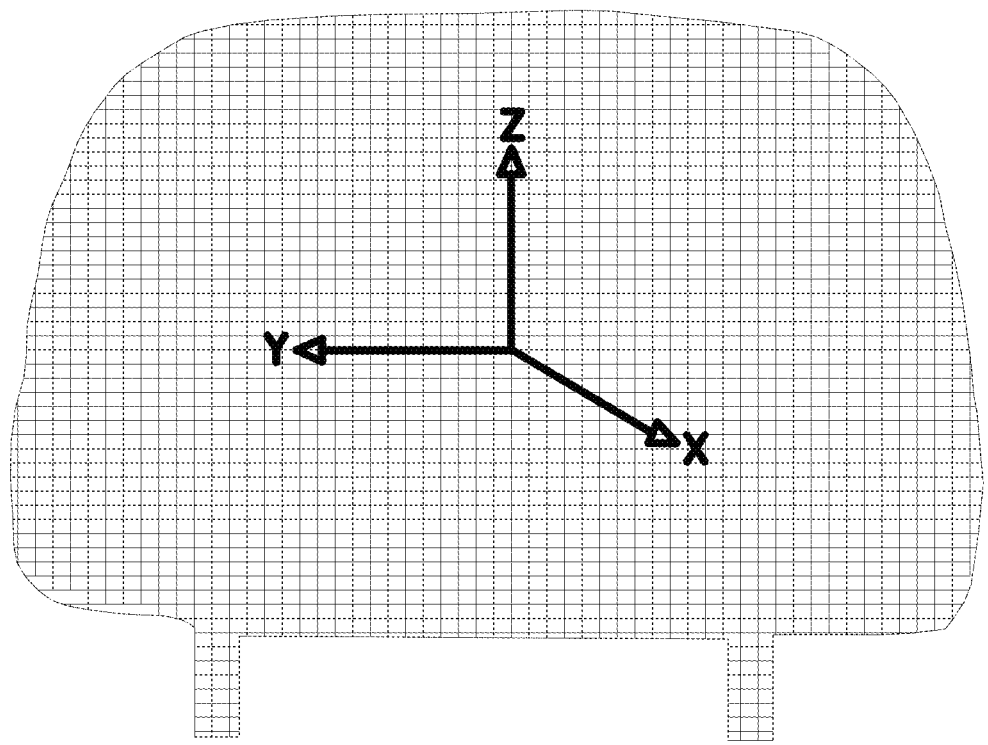
FIG. 5 is a schematic diagram of distribution of cut planes of a headrest position.
Figure 6:
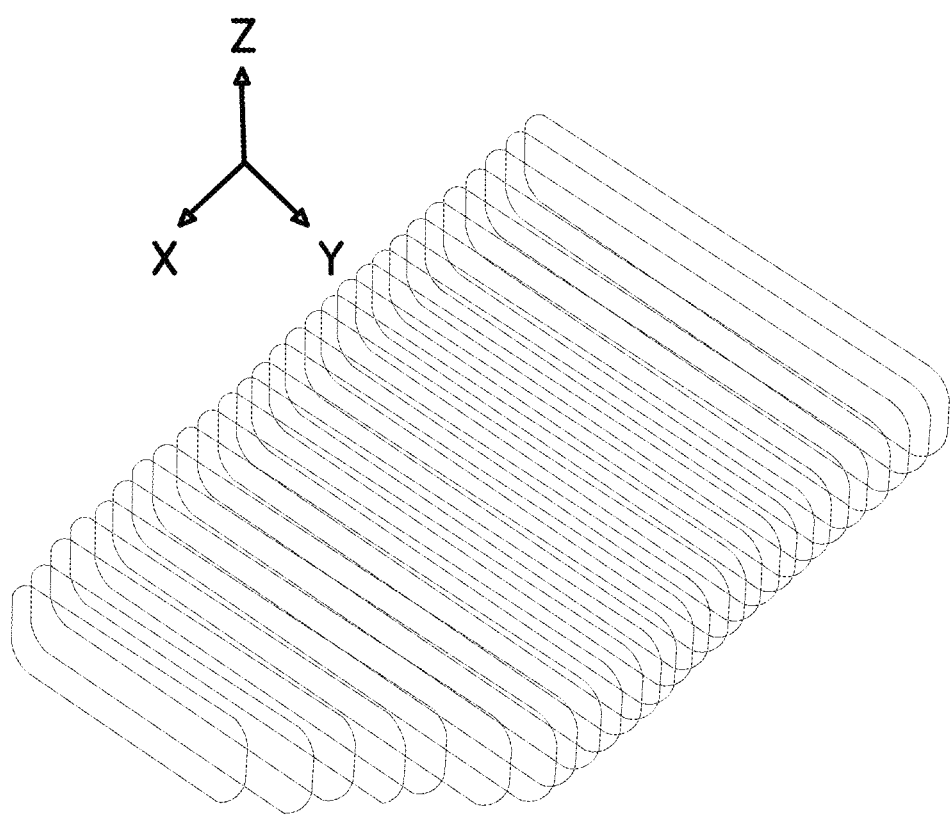
FIG. 6 is a schematic diagram of distribution of cut planes of a cushion position.

Specifically, please refer to FIGS. 5 and 6, define the cut planes as a group of planes parallel to the scanning lines and having a spacing of d. The spacing d should not be too large because the larger the value of the spacing d, the greater the error; and if the spacing d is too small and there are too many layers, the purpose of layering cannot be achieved. Therefore, the size of the spacing d should be set according to the actual situation. According to the present application, the point cloud data in the second point cloud data set is analyzed to find that the point cloud data is distributed according to the scanning line and has a spacing of about unit 1. Therefore, the spacing d between every two adjacent cut planes is defined as unit 1 in the present application.

Specifically, according to the distribution of the point cloud data in the second point cloud data set, the point cloud data is layered, and the arrangement direction of a plurality of cut planes is defined as the direction of the scanning lines. The scanning lines are perpendicular to Y coordinate axis, a group of point cloud data is densely distributed at a spacing of greater than unit 1 in the direction of Y coordinate axis, and the coordinate values of the group of point cloud data are basically the same. Therefore, according to the present application, first, the minimum value of the corresponding Y coordinate in all the point cloud data in the second point cloud data set is calculated, the integer part of the coordinate value is taken as the coordinate of the first defined cut plane, then, the maximum value of the corresponding Y coordinate in all the point cloud data in the second point cloud data set is calculated, the integer part of the coordinate value is used as the coordinate of the last cut plane, and the number of the cut planes is increased with a spacing of d=1 in the middle to finish selection of the cut plane of the point cloud data at the position of the headrest 3 of the seat. Select the cut planes of the point cloud data at the positions of the cushion 1 and backrest of the seat according to the above method.

Specifically, the present application defines the normal direction of the cut planes of the headrest 3 as the positive direction of Y coordinate axis, and when the spacing d=1, a total of 268 cut planes are defined for the headrest 3; the normal direction of the cut planes of the cushion 1 is the positive direction of X coordinate axis, and when the spacing d=1, a total of 704 cut planes are defined for the cushion 1; and the normal direction of the cut planes of the back 2 of the seat is the positive direction of Y coordinate axis, and when the spacing d=1, a total of 612 cut planes are defined for the back 2 of the seat.

Specifically, based on the above method for selecting the cut planes, the point cloud data is determined as the point cloud data corresponding to the cut plane, where the difference between the coordinate value of the point cloud data and the coordinate value corresponding to each cut plane is less than the set threshold. Due to the fact that the spacing d between the cut planes is defined as d=1 when the cut planes are defined, the set threshold is defined as 1 here. Through the method, the point cloud data can be acquired as the point cloud data corresponding to the cut plane, and the distance between the point cloud data and the cut plane is less than the set threshold. However, the point cloud data obtained through the method is still data points in a three-dimensional space, and the point cloud data still cannot be processed in a two-dimensional space. Therefore, the point cloud data item is projected onto the corresponding cut plane, and the projection points are used to replace the spatial points that are not on the cut plane to obtain the point cloud data corresponding to the cut plane. Due to the fact that the point cloud data of each layer is projected on the corresponding cut plane, and the coordinate values of the cut plane are all less than the corresponding coordinate values of the point cloud data of the corresponding layer, and the point cloud data of each layer only moves by a distance less than unit 1 in the same direction. For the headrest 3, cushion 1 and back 2 of the seat with coordinate values of several hundred units, the movement does not affect the basic contour of the second seat three-dimensional model, and the error has little impact on the result.

The experiment shows that after layering, the point cloud data is distributed layer by layer, and the framework of the entire second seat three-dimensional model remains basically unchanged, and the error is small. In practical application, the size of the spacing d can be selected according to specific circumstances. So, in order to show a clear effect, we increases the spacing d between the cut planes, set the spacing d between the cut planes corresponding to the headrest 3 to 10, and thus divide the cut plane of the headrest 3 into 26 layers; set the spacing d between the cut planes corresponding to the cushion 1 to 20, and thus divide the cut plane of the cushion 1 into 36 layers; and set the spacing d between the cut planes of the back 2 of the seat to 20, and thus divide the cut plane of the back 2 of the seat into 30 layers. In an actual experiment, the spacing between adjacent cut planes is set to unit 1, and the layering effect is more precise.

Figure 1D:
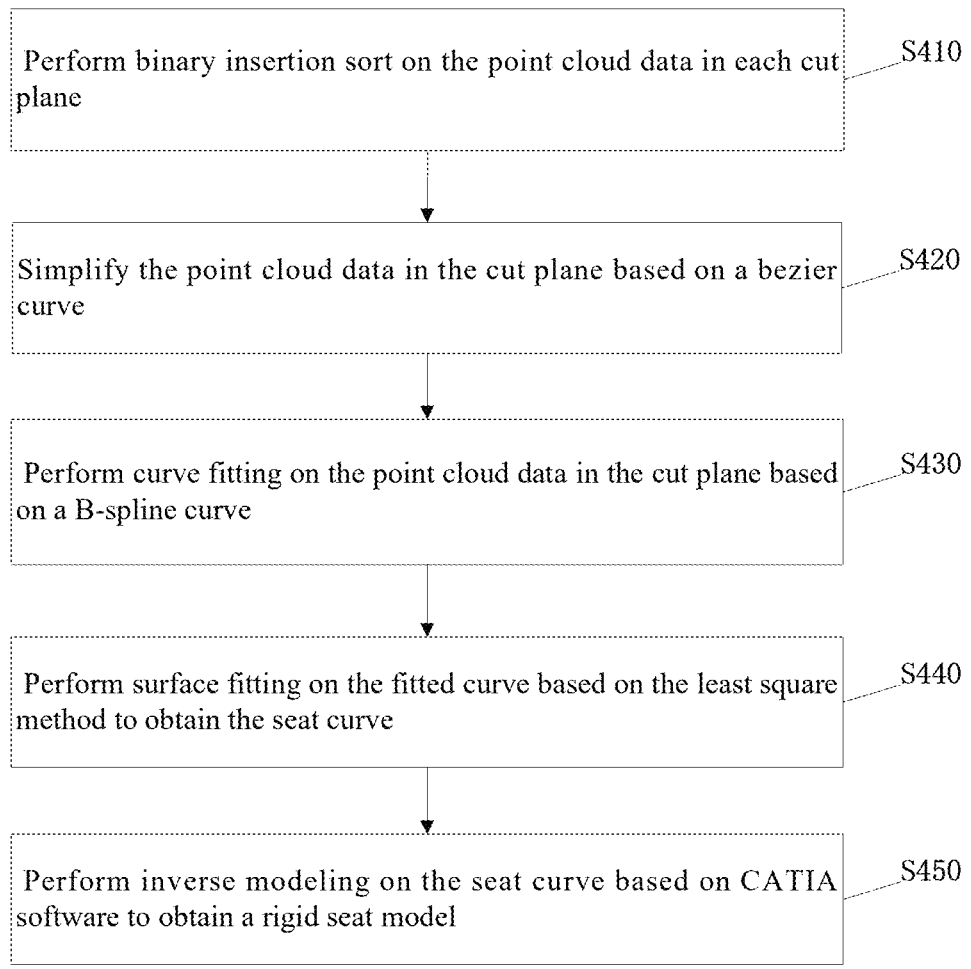
FIG. 1d is a flow chart IV of steps of a method for manufacturing a seat for measuring a standard driving posture of a human body of the present application.

Further, referring to FIG. 1*d*, performing inverse modeling on the second point cloud data set to obtain a rigid seat model in S400 specifically includes the following steps:

S410: performing binary insertion sort on the point cloud data in each cut plane;

S420: simplifying the point cloud data in the cut plane based on a bezier curve;

S430: performing curve fitting on the point cloud data in the cut plane based on a B-spline curve;

S440: performing surface fitting on the fitted curve based on the least square method to obtain the seat curve; and S450: performing inverse modeling on the seat curve based on CATIA software to obtain a rigid seat model.

Specifically, in S410, in order to further process the second point cloud data set and fit curves and surfaces, it is necessary to sort the point cloud data within each cut plane. The point cloud data in each layer is a layer of contour of the model to generate an approximate circular curve. Therefore, according to the present application, the point cloud data is sorted in a circle in a clockwise direction. Due to the large amount of point cloud data corresponding to the models of the headrest 3, cushion 1 and back 2 of the seat, it is necessary to read and store the point cloud data in an array while sorting the point cloud data during implementation. Therefore, two operations namely "search" and "insertion" are needed. As the point cloud data is orderly and is large in quantity, so binary insertion sort is selected in the present application.

Based on the analysis of the point cloud data of all parts of models of the seat, the headrest 3 and the cushion 1 are layered in the direction of Y coordinate axis, and the point cloud data is sorted by comparing coordinate values of Z coordinate axis and coordinate values of X coordinate axis; the back 2 of the seat is layered in the direction of X coordinate axis and the point cloud data is sorted by comparing coordinate values of Y coordinate axis and coordinate values of Z coordinate axis.

Here, the headrest 3 is used as an example to illustrate how to sort the point cloud data within the same cut plane. The headrest 3 is layered along Y coordinate axis and the distribution manner of the point cloud data in each layer is the same. The point cloud data in layer y=0 is analyzed and sorted, and the same method can be used to sort the point cloud data in other layers.

Figure 1E:
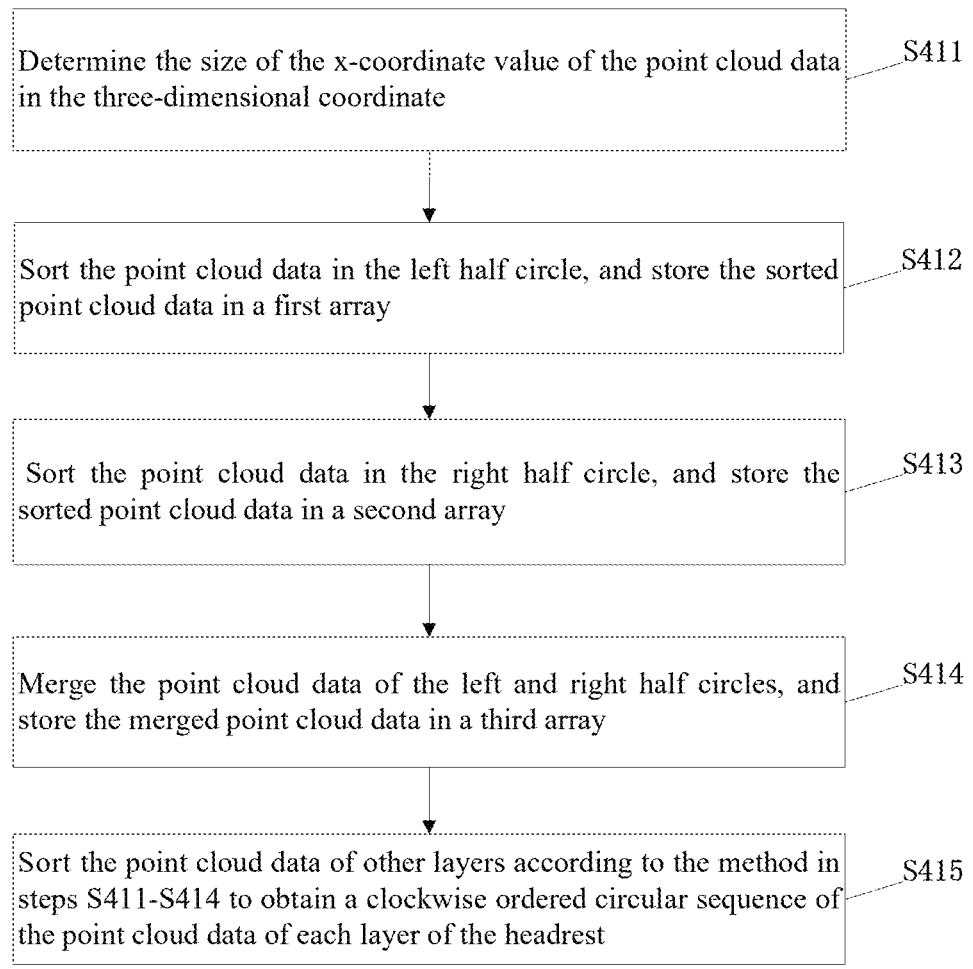
FIG. 1e is a flow chart V of steps of a method for manufacturing a seat for measuring a standard driving posture of a human body of the present application.

Referring to FIG. 1*e*, the specific sorting process is:

S411: determining the size of the x-coordinate value of the point cloud data in the three-dimensional coordinate, where the point cloud data with x≥0 belongs to the right half circle, and the point cloud data with x≤0 belongs to the left half circle;

S412: sorting the point cloud data in the left half circle, and storing the sorted point cloud data in a first array: sorting the point cloud data according to the size of the z-coordinate value of the point cloud data, with the point cloud data having smaller z-coordinate value sorted in the front part and the point cloud data having larger z-coordinate value sorted in the back part; when the z-coordinate value is relatively small, the sorting of the point cloud data is based on the size of the z-coordinate value, and a desired sorting result cannot be obtained. Therefore, the point cloud data that cannot be sorted correctly is selected and sorted by comparing the x-coordinate value, with the point cloud data having larger x-coordinate value sorted in the front part and the point cloud data having smaller x-coordinate value sorted in the back part; and sorting the point cloud data in the left half circle in a clockwise direction;

S413: sorting the point cloud data in the right half circle, and storing the sorted point cloud data in a second array: sorting the point cloud data according to the size of the z-coordinate value of the point cloud data, with the point cloud data having larger z-coordinate value sorted in the front part and the point cloud data having smaller z-coordinate value sorted in the back part; when the z-coordinate value is relatively small, sorting the point cloud data by comparing the x-coordinate value, with the point cloud data having larger x-coordinate value sorted in the front part and the point cloud data having smaller x-coordinate value sorted in the back part; and sorting the point cloud data in the right half circle in a clockwise direction;

S414: merging the point cloud data of the left and right half circles, and storing the merged point cloud data in a third array: the point cloud data of the left and right half circles have been ordered and stored in the corresponding array, and copying the point cloud data in the first array corresponding to the left half circle to the third array; next, copying the point cloud data in the second array corresponding to the right half circle to the third array, where the point cloud data stored in the third array is the point cloud data with ordered sequences within the cut plane; and implementing a clockwise ordered circular sequence of the point cloud data in this layer; and S415: sorting the point cloud data of other layers according to the method in steps S411-S414 to obtain a clockwise ordered circular sequence of the point cloud data of each layer of the headrest 3.

By referring to the above method of sorting the point cloud data at the position of the headrest 3, the point cloud data at the positions of the cushion 1 and the back 2 of the seat are sorted to correspondingly obtain a clockwise ordered circle sequence of the point cloud data at each layer of the cushion 1 and a clockwise ordered circle sequence of the point cloud data at each layer of the back 2 of the seat.

Figure 1F:
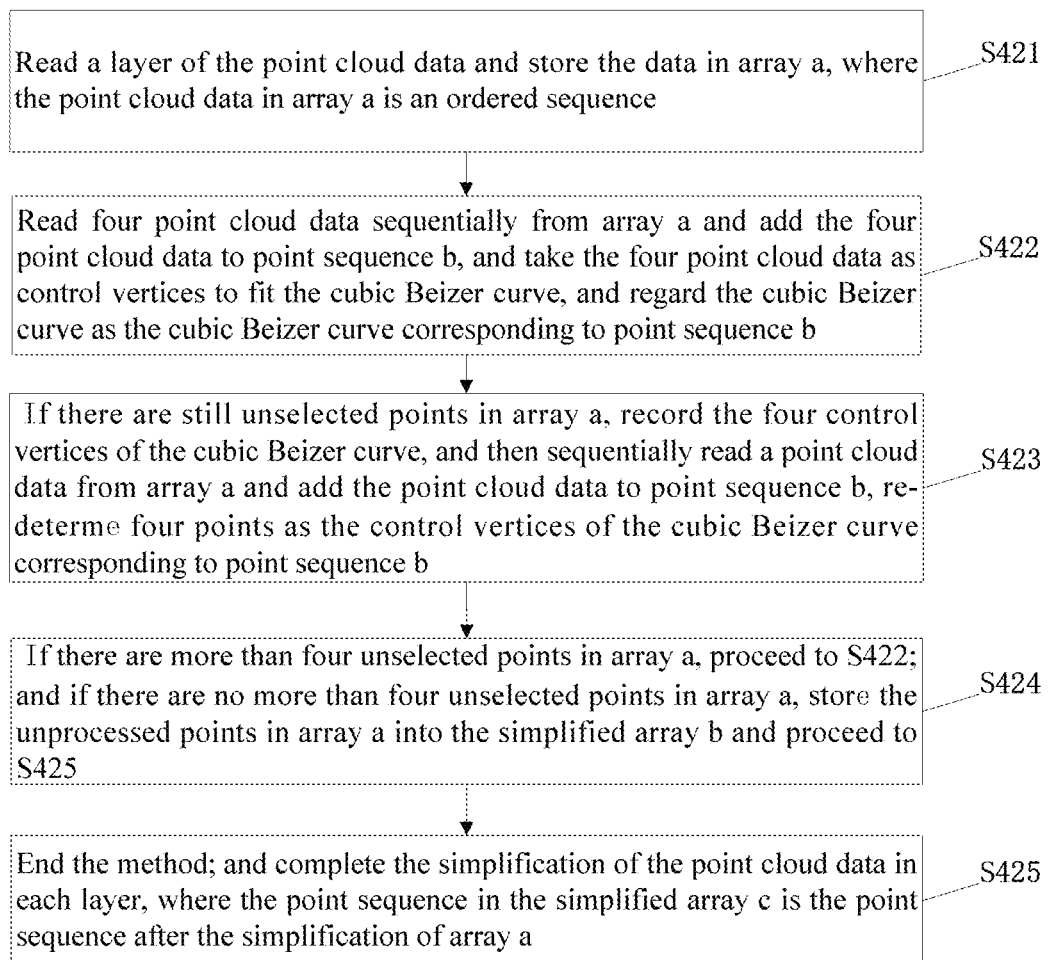
FIG. 1f is a flow chart VI of steps of a method for manufacturing a seat for measuring a standard driving posture of a human body of the present application.

Specifically, in S420, according to the present application, a point cloud data simplification method is proposed based on layering the point cloud data. For the point cloud data in each layer, a group of sequentially arranged point cloud data is read, four points are selected as the control vertices of the cubic Bezier curve corresponding to the group of point cloud data, and the distances between this group of point cloud data and the cubic Bezier curve is calculated and compared with the set error value. If the distances are less than the set error value, the selected four control points are used to replace this group of point cloud data. Referring to FIG. 1*f*, the specific method is as follows:

S421: reading a layer of the point cloud data and store the data in array a, where the point cloud data in array a is an ordered sequence;

S422: reading four point cloud data sequentially from array a and adding the four point cloud data to point sequence b, and taking the four point cloud data as control vertices to fit the cubic Beizer curve, and regarding the cubic Beizer curve as the cubic Beizer curve corresponding to point sequence b;

S423: if there are still unselected points in array a, recording the four control vertices of the cubic Beizer curve, and then sequentially reading a point cloud data from array a and adding the point cloud data to point sequence b, re-determining four points as the control vertices of the cubic Beizer curve corresponding to point sequence b; the specific determination method is as follows: enabling the first point in point sequence b to be the first control vertex of the cubic Bezier curve, enabling the last point in point sequence b to be the last control vertex of the Bezier curve, and obtaining the second and third control vertices by averaging all other points in point sequence b except for the first and last points; then, calculating the distance between each point in point sequence b and the corresponding cubic Beizer curve and comparing the distance with the set error value, where the set error value is preferably 0.2 mm; if the distance is less than the set error value, proceeding to S423; if there are points, the distance between each of which and the corresponding cubic Beizer curve is greater than the set error value, storing the four recorded points in a simplified array c, emptying the points in the point sequence b, and proceeding to S424; and if there are no unselected points in array a, storing the four control vertices of the cubic Bezier curve into the simplified array c, and proceeding to S425;

S424: if there are more than four unselected points in array a, proceeding to S422; and if there are no more than four unselected points in array a, storing the unprocessed points in array a into the simplified array b and proceeding to S425; and S425: ending the method; and completing the simplification of the point cloud data in each layer, where the point sequence in the simplified array c is the point sequence after the simplification of array a.

The experiment indicates that the original point cloud data at the headrest 3 is 813,445, and after simplification, the point cloud data is 9,725. The simplification rate (number of point cloud data after simplification/number of original point cloud data) is about 1/80;

the original point cloud data at the cushion 1 is 1,956,233, and after simplification, the point cloud data is 54,297, with a simplification rate of about 1/40;

the original point cloud data at the back 2 of the seat is 2,293,662, and after simplification, the point cloud data is 80,445, with a simplification rate of about 1/30.

the simplification method reduces the amount of point cloud data while ensuring the shape of the model, thereby increasing the calculation efficiency in subsequent processing.

Specifically, in S430, according to the present application, cubic uniform (i.e. fourth-order) B-spline curves are used to perform curve fitting on point cloud data of each layer of the headrest 3, cushion 1 and back 2 of the seat to obtain curve models for all positions of the seat. The NURBS interface, provided by the Open GL practical function library, is used to draw Nurbs spline curves. B-spline curves are Nurbs curves with a weight of 1, so B-spline curves and surfaces are also drawn by using the interface. The interface is also built on the basis of the evaluator, but it is more flexible and convenient to use. The function gluNurbsCurve( ) is used to draw a B-spline curve and complete the curve fitting of all point cloud data of the seat.

Figure 7:
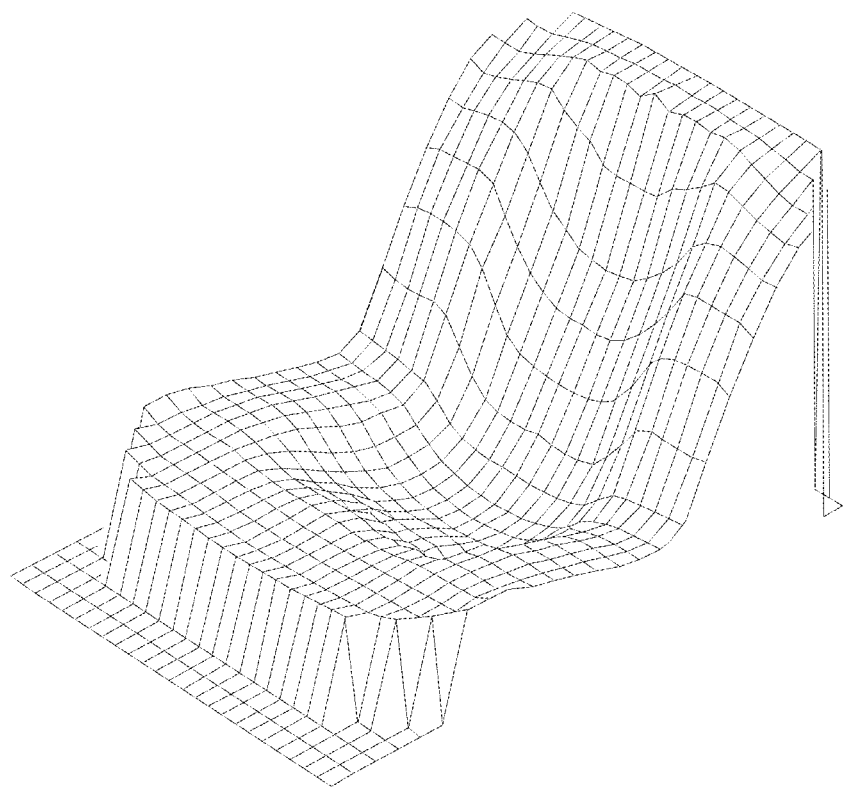
FIG. 7 is a schematic diagram of a seat fitting surface.

Specifically, in S440, plane and paraboloid fitting are realized to the curve obtained through fitting in S43 through a linear least square method, and the fitting results are shown in FIG. 7.

Figure 8:
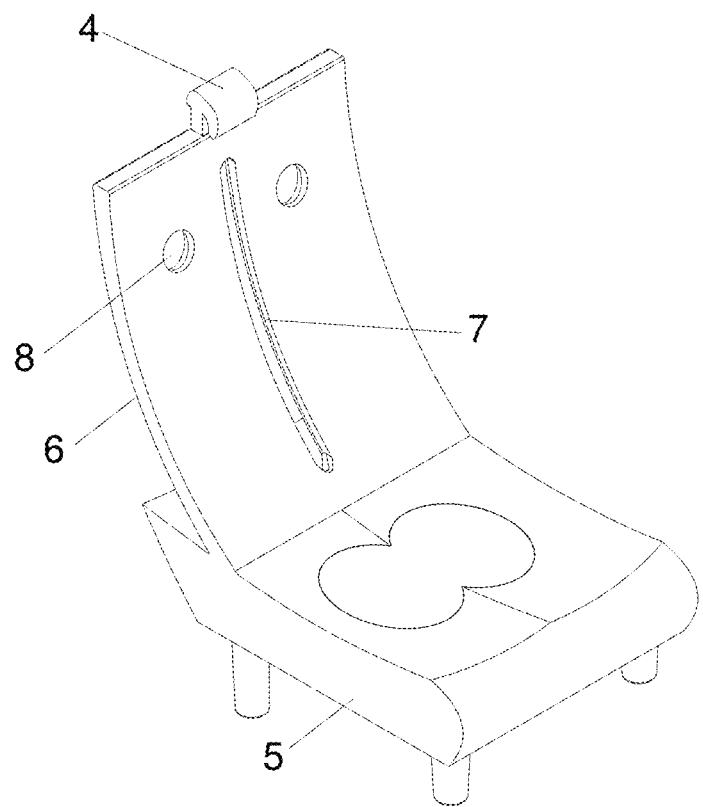
FIG. 8 is a schematic structure diagram of a rigid seat.
Figure 9:
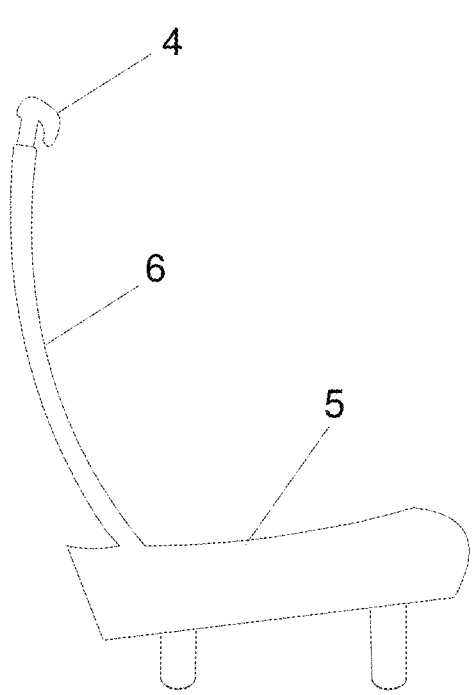
FIG. 9 is a schematic structure diagram of a side view of the rigid seat.

Further, please refer to FIGS. 8 and 9, the rigid seat includes a sitting plate 5 for sitting and a backup plate 6 for back leaning, and the after manufacturing a rigid seat according to the seat curve further includes the following steps:

forming a first measuring hole 7 in the middle of the backup plate 6, where the first measuring hole 7 takes the shape of a long strip and extends in the vertical direction; and forming a second measuring hole 8 in the backup plate 6 corresponding to a spealbone, where the second measuring hole 8 is circular.

Specifically, the rigid seat is made of a material that is unlikely to deform, and optionally, the material of the rigid seat is alloy steel or 45 steel.

Specifically, the first measuring hole 7 runs through both sides of the backup plate 6 and extends in the length direction of the backup plate 6. The width of the first measuring hole 7 is set to 2 cm, and the first measuring hole 7 facilitates the measurement of measuring points on the back of a human body by using a three coordinates measuring instrument or a manual measuring tool. The measuring points on the back of a human body include: the fourth thoracic vertebra point, the eighth thoracic vertebra point, the thoracic vertebrae-lumbar vertebrae joint point, the thoracic vertebrae-sacral vertebrae joint point, etc.

Specifically, the second measuring hole 8 runs through both sides of the backup plate 6 and has a diameter of 3 cm. Two second measuring holes 8 are provided and are corresponding to the left and right spealbone respectively. The second measuring holes 8 facilitate the search for measuring points and facilitate measurement.

Specifically, based on the horizontal distance between the cervical spine point of the driver and the backup plate 6 obtained through measurement and the vertical distance between the cervical spine point and the ground, the head position of the driver is calculated, and a neck pillow 4 is arranged at the cervical spine point to fix the head position of the driver. The headrest 3 of the rigid seat is not arranged because the head of the driver needs to be measured.

Described above are only preferred embodiments of the present application and descriptions of the applied technical principles. Those skilled in the art should understand that, the invention scope referred to in the present application is not limited to the technical solutions formed by specific combinations of the technical features, but should also cover other technical solutions formed by any combination of the technical features or equivalent features without departing from the invention concept. For example, technical solutions formed by replacing the features with (but not limited to) technical features with similar functions in the present application are included.

What is claimed is:

1. A method for manufacturing a seat for measuring a standard driving posture of a human body, implementation of the method being based on an auxiliary device, wherein the auxiliary device is a seat, N sensor groups are arranged on the seat, each sensor group comprises a group of displacement sensors on a back of the seat and a group of displacement sensors on a cushion, the group of displacement sensors on the back of the seat is arranged in a length direction of the back of the seat, and the group of displacement sensors on the cushion is arranged in the length direction of the cushion;

the method comprises following steps:

S100: selecting a plurality of testers and performing three-dimensional scanning on the auxiliary device to acquire a first point cloud data set, wherein the first point cloud data set comprises a plurality of point cloud data;

S200: acquiring a plurality of groups of displacement data sets, and constructing N seat curves according to the plurality of groups of displacement data sets, wherein the displacement data sets comprise displacement values measured by all displacement sensors when one of the testers is on the auxiliary device and keeps a standard driving posture;

S300: correspondingly processing the N seat curves and the first point cloud data set to delete the point cloud data above the seat curves so as to adjust the first point cloud data set and obtain a second point cloud data set; and S400: performing inverse modeling on the second point cloud data set to obtain a rigid seat model, and manufacturing a rigid seat according to the rigid seat model;

wherein S300 specifically comprises the following steps:

S310: obtaining a first seat three-dimensional model according to the first point cloud data set, and placing the N seat curves in corresponding positions of the first seat three-dimensional model according to a position of each displacement sensor on the auxiliary device;

S320: according to the N seat curves, dividing a plurality of point cloud data in the first point cloud data set into N+1 point cloud areas in the first seat three-dimensional model;

S330: selecting one point cloud area, and determining a reference seat curve corresponding to the point cloud area, wherein the reference seat curve is the seat curve adjacent to the point cloud area, and obtaining the reference seat curve corresponding to each point cloud area among the N+1 point cloud areas; and S340: deleting the point cloud data whose position is higher than the reference seat curve in a vertical direction in each point cloud area to adjust the first point cloud data set so as to obtain the second point cloud data set;

wherein the method further comprises the following steps between S340 and S400:

S350: obtaining a second seat three-dimensional model according to the second point cloud data set, and determining a plurality of parallel cut planes according to the direction of scanning lines in the second seat three-dimensional model, wherein the distance between every two adjacent cut planes is greater than that between every two adjacent scanning lines; and S360: projecting the point cloud data in the second point cloud data set onto the corresponding cut planes, and deleting the point cloud data outside the cut planes to adjust the second point cloud data set;

wherein the rigid seat comprises a sitting plate for sitting and a backup plate for back leaning, and after manufacturing a rigid seat according to the rigid seat model, the method further comprises following steps:

forming a first measuring hole in the middle of the backup plate, wherein the first measuring hole takes the shape of a long strip and extends in the vertical direction; and forming a second measuring hole in the backup plate corresponding to a spealbone, wherein the second measuring hole is circular.

2. The method according to claim 1, wherein S200 specifically comprises the following steps:

S210: placing a tester on the auxiliary device, after adjusting the tester to a standard driving posture, reading the displacement distance of the displacement sensor in each position, and constructing a group of displacement data sets with all of the read displacement distances;

S220: repeating S210, and testing all testers to acquire a plurality of groups of displacement data sets;

S230: calculating the displacement mean value of each displacement sensor according to the plurality of groups of displacement data sets;

S240: constructing a seat curve with the displacement mean values corresponding to all displacement sensors in the same sensor group; and S250: repeating S240 to obtain N seat curves.

3. The method according to claim 2, wherein the performing inverse modeling on the second point cloud data set to obtain a rigid seat model in S400 specifically comprises the following steps:

S410: performing binary insertion sort on the point cloud data in each cut plane;

S420: simplifying the point cloud data in the cut plane based on a bezier curve;

S430: performing curve fitting on the point cloud data in the cut plane based on a B-spline curve;

S440: performing surface fitting on the fitted curve based on the least square method to obtain the seat curve; and S450: performing inverse modeling on the seat curve based on CATIA software to obtain a rigid seat model.

4. The method according to claim 1, wherein the sensor groups are distributed sparsely at positions close to an axis of symmetry of the seat and are distributed densely at positions away from the axis of symmetry of the seat.

* * * * *